United States Patent
Tamaoki et al.

(10) Patent No.: US 8,673,446 B2
(45) Date of Patent: Mar. 18, 2014

(54) GRAPHITE COMPLEX AND MANUFACTURING METHOD THEREOF

(75) Inventors: Mitsuru Tamaoki, Hokkaido (JP);
Norihiro Kawamura, Hokkaido (JP);
Kazuhiko Kubo, Hokkaido (JP);
Masashi Funaba, Hokkaido (JP)

(73) Assignee: Panasonic Corporation, Osaka (JP)

( * ) Notice: Subject to any disclaimer, the term of this patent is extended or adjusted under 35 U.S.C. 154(b) by 145 days.

(21) Appl. No.: 12/990,445

(22) PCT Filed: Mar. 17, 2009

(86) PCT No.: PCT/JP2009/001167
§ 371 (c)(1),
(2), (4) Date: Oct. 29, 2010

(87) PCT Pub. No.: WO2009/147771
PCT Pub. Date: Dec. 10, 2009

(65) Prior Publication Data
US 2011/0045300 A1    Feb. 24, 2011

(30) Foreign Application Priority Data
Jun. 2, 2008   (JP) ................... 2008-144471

(51) Int. Cl.
*B32B 9/00* (2006.01)

(52) U.S. Cl.
USPC ......................................... 428/408; 423/448

(58) Field of Classification Search
USPC .............. 428/408; 423/447.1, 447.2; 165/185
See application file for complete search history.

(56) References Cited

U.S. PATENT DOCUMENTS

| | | | |
|---|---|---|---|
| 5,648,027 A * | 7/1997 | Tajiri et al. ..................... | 264/43 |
| 7,108,917 B2 * | 9/2006 | Klug ............................ | 428/408 |
| 2004/0245668 A1 * | 12/2004 | Gough et al. ................. | 264/136 |
| 2005/0150649 A1 | 7/2005 | Tsukamoto | |

FOREIGN PATENT DOCUMENTS

| | | |
|---|---|---|
| JP | 11-240706 | 9/1999 |
| JP | 2000-169126 | 6/2000 |
| JP | 2001-144237 | 5/2001 |
| JP | 2002-284514 | 10/2002 |
| JP | 2003-092384 | 3/2003 |
| JP | 2003-092384 A | 3/2003 |
| JP | 2005-229100 | 8/2005 |

* cited by examiner

*Primary Examiner* — Maria Veronica Ewald
*Assistant Examiner* — Daniel H Miller
(74) *Attorney, Agent, or Firm* — McDermott Will & Emery LLP

(57) ABSTRACT

A graphite complex has a pyrolytic graphite sheet and a graphite layer. The pyrolytic graphite sheet is made by firing a polymer film. The graphite layer contains graphite powder as the main ingredient and is directly joined to the pyrolytic graphite sheet.

4 Claims, 4 Drawing Sheets

GRAPHITE COMPLEX AND MANUFACTURING METHOD THEREOF

RELATED APPLICATIONS

This application is the U.S. National Phase under 35 U.S.C. §371 of International Application No. PCT/JP2009/001167, filed on Mar. 17, 2009, which in turn claims the benefit of Japanese Application No. 2008-144471, filed on Jun. 2, 2008, the disclosures of which Applications are incorporated by reference herein.

TECHNICAL FIELD

The present invention relates to a graphite complex for conducting and dissipating heat generated by a heat generating body, and to a manufacturing method of the graphite complex.

BACKGROUND ART

In recent years, electronic devices, as represented by a portable telephone or a personal computer, have been requested to have higher performance, and smaller size and thickness. With this request, the performance and density of electronic components, such as a CPU and an IC, are increased, which considerably increases amount of heat generation by the electronic components. Thus, suppressing a temperature rise in the electronic devices is an important problem to be addressed.

As a measure against heat, the following methods are used. For example, the heat generated in an electronic component, i.e. a heat generating body, is transmitted to a radiator, e.g. a heat sink, via a graphite sheet. Alternatively, the temperature of a heat spot is reduced by promptly diffusing the heat of the heat generating body via a graphite sheet. For such a purpose, a graphite sheet having large thermal conductivity, small thickness, and light weight is requested.

As such a graphite sheet, a pyrolytic graphite sheet and an expanded graphite sheet are used. The pyrolytic graphite sheet is a sheet made by pyrolyzing a polymer film, such as a polyimide film, at a high temperature. The expanded graphite sheet is a sheet made by heating and pressing acid-treated graphite powder into a film shape. In order to enhance the cooling capability with an increase in amount of heat generation by a heat generating body, it is necessary to increase the heat transport amount of the graphite sheet.

The heat transport amount of a graphite sheet is proportional to thermal conductance. When heat conducts in the lengthwise direction of the graphite sheet, the following relation holds.

Thermal conductance (W/K)=thermal conductivity (W/mK)×cross sectional area of sheet÷length of sheet Thus, when the principal surface of a sheet has a fixed shape, increasing the thermal conductivity and thickness of the sheet can increase the thermal conductance.

FIG. 8 is a perspective view of a conventional graphite complex. This complex is formed of pyrolytic graphite sheets 32A and 32B, and adhesive agent 31 bonding these graphite sheets.

When a pyrolytic graphite sheet is used as a graphite sheet for heat transportation and the thickness is increased so as to increase the thermal conductance, it is necessary to increase the thickness of the polymer films as the raw material. However, gas generated from the inside of the films at pyrolysis makes the sheet brittle in a powder form, and thus the thickness of the sheet cannot be increased. Thus, it is a common practice to laminate a plurality of pyrolytic graphite sheets 32A and 32B via adhesive agent 31, such as epoxy resin and urethane resin, so that a graphite complex is formed and the thermal conductance is increased (see Patent Literature 1, for example). However, in this structure, the extremely low thermal conductivity of adhesive agent 31 hinders the sufficient increase in the thermal conductance.

On the other hand, the expanded graphite sheet has a thermal conductivity in the direction of the principal surface lower than that of a pyrolytic graphite sheet. That is, when an expanded graphite sheet having a thickness equal to that of the pyrolytic graphite sheet is used as a graphite sheet for heat transportation, the expanded graphite sheet has a smaller thermal conductance. Further, the expanded graphite sheet is likely to delaminate as the thickness is increased, and thus is difficult to handle. Therefore, the thermal conductance of the expanded graphite sheet cannot be increased. For this reason, in order to increase the thickness of the expanded graphite sheet, it is a common practice to place a metal mesh body on the front and back sides or in the intermediate part of the expanded graphite sheet so that a graphite complex is formed (see Patent Literature 2, for example). However, in this structure, the thermal conductivity of the metal is smaller than that of the expanded graphite sheet, and thus the thermal conductance cannot be increased sufficiently.

Patent literature 1: Japanese Patent Unexamined Publication No. 2001-144237

Patent literature 2: Japanese Patent Unexamined Publication No. 2005-229100

SUMMARY OF THE INVENTION

The present invention is directed to provide a graphite complex that has an increased thermal conductance. The graphite complex of the present invention has the following elements:

a pyrolytic graphite sheet made by firing a polymer film; and a graphite layer containing graphite powder as the main ingredient and directly joined to the pyrolytic graphite sheet.

In a manufacturing method of a graphite complex of the present invention, after placing the pyrolytic graphite sheet and a molded graphite sheet formed of graphite powder as the main ingredient one on the other in contact with each other, the pyrolytic graphite sheet and the molded graphite sheet are joined by pressing.

As described above, in the graphite complex of the present invention, the pyrolytic graphite sheet and the graphite layer are joined together in direct contact with each other. This prevents a decrease in the thermal conductivity in the interface where the pyrolytic graphite sheet and the graphite layer are in contact with each other. Thus, a graphite complex having a large thermal conductance can be produced.

DETAILED DESCRIPTION OF PREFERRED EMBODIMENT

Figure 1:
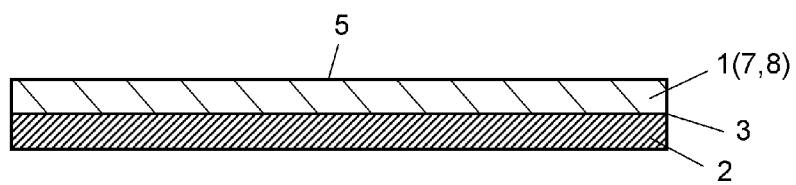
FIG. 1 is a schematic sectional view of a graphite complex in accordance with an exemplary embodiment of the present invention.

FIG. 1 is a schematic sectional view of a graphite complex in accordance with an exemplary embodiment of the present invention. This graphite complex is formed by laminating pyrolytic graphite sheet (hereafter referred to as graphite sheet) 1 and graphite layer 2. Graphite sheet 1 and graphite layer 2 are joined in interface 3 where graphite sheet 1 and graphite layer 2 are in direct contact with each other. This structure prevents a decrease in the thermal conductivity in interface 3 where graphite sheet 1 and graphite layer 2 are in contact with each other. Thus, the graphite complex having a large thermal conductance can be produced.

Graphite sheet 1 is made by firing a polymer film. In graphite sheet 1, layered graphite particles having a large crystal size is oriented in the direction along principal surface 5. Those layered graphite particles are laminated.

It is preferable to use heat-resistant aromatic polymers, such as polyimide, polyamide, and polyamideimide, for the polymer film, i.e. the raw material of graphite sheet 1. When such a raw material is used, graphite sheet 1 has extremely high thermal conductivity. The thermal conductivity in the direction along principal surface 5 ranges from 400 W/mK to 1800 W/mK.

Preferably, the thickness of graphite sheet 1 ranges from 10 μm to 150 μm. Such a thickness can provide high thermal conductivity and ensure the shape of the sheet.

Graphite layer 2 contains graphite powder as the main ingredient. Specifically, scaly graphite powder is deposited so as to be oriented along principal surface 5. Examples of the graphite powder include scaly or spherical graphite powder of expanded graphite and pyrolytic graphite which is made by heat-treating powder cokes at a temperature of approximately 3000° C. In order to enhance the strength of graphite layer 2, a trace quantity of binder, such as resin, may be added. However, the expanded graphite can be formed into graphite layer 2 having high thermal conductivity by pressing without binder because the expanded graphite has plasticity. Thus, it is preferable to use expanded graphite as the graphite powder. It is also preferable that graphite layer 2 contains carbon at 98 wt % or higher in order to provide high thermal conductivity.

Use of such a material provides a thermal conductivity of 100 W/mK to 350 W/mK in the direction along principal surface 5 of graphite layer 2. In a case that the thermal conductivity is equal to or lower than 200 W/mK, it is preferable that the thickness of graphite layer 2 ranges from 200 μm to 1500 μm. In a case that the thermal conductivity is equal to or higher than 300 W/mK, it is preferable that the thickness ranges from 50 μm to 500 μm. Such a thickness can prevent delamination of graphite layer 2 and ensure the shape of the sheet.

The thermal conductivity of the graphite complex can be expressed by apparent thermal conductivity. In the graphite complex where one graphite sheet 1 and one graphite layer 2 are joined in close contact with each other as shown in FIG. 1, the thermal conductivity does not decrease in interface 3. Thus, apparent thermal conductivity λ in the direction along principal surface 5 is obtained by the following equation:

$$\lambda = \lambda_1 \times p + \lambda_2 \times q$$

Here, p is the ratio of the thickness of graphite sheet 1 to the thickness of the graphite complex, q is the ratio of the thickness of graphite layer 2 to the thickness of the graphite complex. $\lambda_1$ and $\lambda_2$ are the heat conductivities of graphite sheet 1 and graphite layer 2, respectively.

Thermal conductivity $\lambda_1$ of graphite sheet 1 is larger than thermal conductivity $\lambda_2$ of graphite layer 2. Thus, the apparent thermal conductivity of the graphite complex takes a value smaller than thermal conductivity $\lambda_1$ of graphite sheet 1 and larger than thermal conductivity $\lambda_2$ of graphite layer 2. That is, in the graphite complex, the thermal conductance in the direction along principal surface 5 is larger than that of a molded graphite sheet that has a structure similar to that of graphite layer 2 and a thickness equal to that of the graphite complex.

The graphite complex can be made thicker than a single pyrolytic graphite sheet. Thus, the thermal conductance in the direction along principal surface 5 can be increased. Preferably, the thickness of the graphite complex is equal to or larger than 100 μm, which is larger than that of a single pyrolytic graphite sheet. More preferably, the thickness of the graphite complex is equal to or larger than 150 μm.

As described above, graphite sheet 1 is made by firing a polymer film. Preferably, graphite sheet 1 is roll-pressed after the firing. This operation can increase the joining strength between graphite layer 2 and graphite sheet 1 (8) in interface 3.

Figure 2:
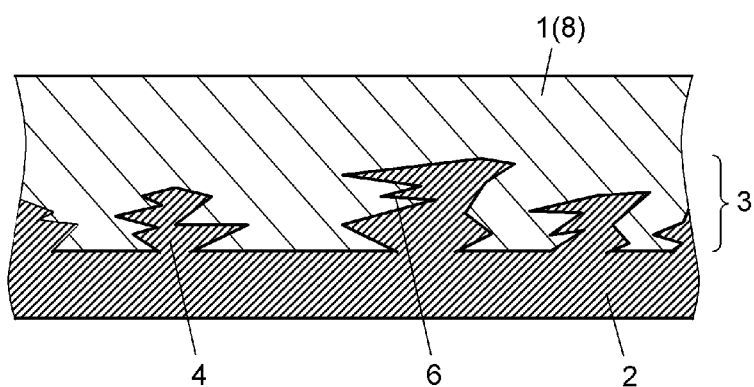
FIG. 2 is an enlarged sectional view showing an interface between a pyrolytic graphite sheet and a graphite layer in the graphite complex of FIG. 1.
Figure 3A:
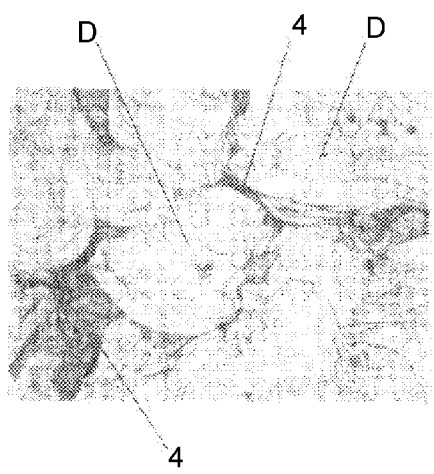
FIG. 3A shows a microphotograph of a surface of the roll-pressed pyrolytic graphite sheet for use in the graphite complex in accordance with the exemplary embodiment of the present invention.
Figure 3B:
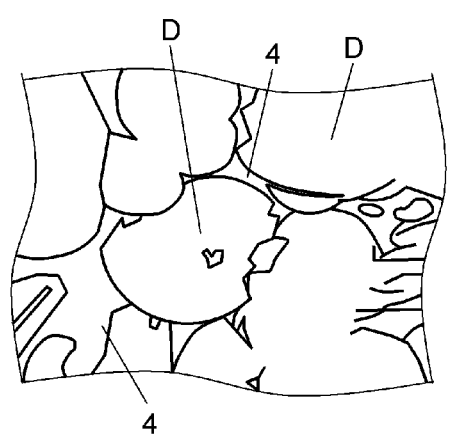
FIG. 3B is a schematic diagram of FIG. 3A.

FIG. 2 is an enlarged sectional view showing the interface between the pyrolytic graphite sheet and the graphite layer. FIG. 3A shows a microphotograph of a surface of the roll-pressed pyrolytic graphite sheet. FIG. 3B is a schematic diagram thereof.

As shown in FIG. 2, recesses 4 are formed in interface 3 on the surface of roll-pressed graphite sheet 8. The graphite powder of graphite layer 2 is packed into recesses 4, so that graphite sheet 8 and graphite layer 2 are connected tightly in interface 3. Recesses 4 are formed in the boundaries between flat regions D formed of graphite as shown in FIG. 3A and FIG. 3B.

On the surface of the pyrolytic graphite sheet after firing, a large number of protrusions of the layers in the layered part of the graphite particles in the vicinity of the surface are formed. Recesses 4 are formed by roll-pressing these protrusions so that these protrusions are folded.

Recesses 4 have wrinkle-shaped projections 6 therein. Projections 6 are formed such that portions where the layered portion of the pyrolytic graphite particles is folded by roll-pressing projects in the direction along principal surface 5.

Since recesses 4 have projections 6, the graphite powder makes close contact with recesses 4. The anchor effect enhanced in this manner increases the joining strength between graphite sheet 8 and graphite layer 2. This structure can prevent delamination caused by the difference in thermal expansion between graphite sheet 8 and graphite layer 2 in a high-temperature environment, and provide excellent handleability when the graphite complex is installed in an electronic device.

Further, since recesses 4 of graphite sheet 8 in interface 3 is filled with the graphite powder in this manner, the thermal conductivity in interface 3 does not become smaller than the thermal conductivity of the packed graphite powder. This increases the thermal conductivity in interface 3, thus increasing the apparent thermal conductivity of the graphite complex in the direction along principal surface 5. Further, this structure does not adversely affect the thermal conductivity of the graphite complex in the thickness direction, thus increasing the thermal conductivity in the thickness direction. Graphite sheet 8 and graphite layer 2 laminated with each other closely in this manner can increase the thermal conductivity in interface 3. Thus, a graphite complex having a large thermal conductance can be produced.

Figure 4A:
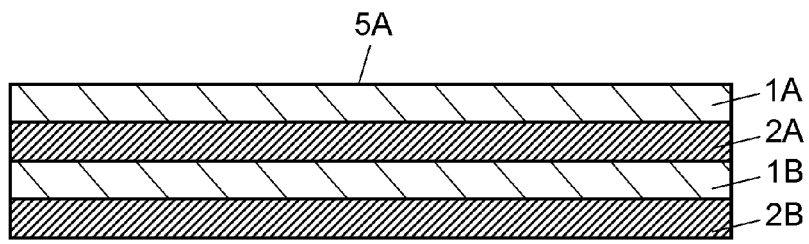
FIG. 4A is a schematic sectional view of another graphite complex in accordance with the exemplary embodiment of the present invention.
Figure 4B:
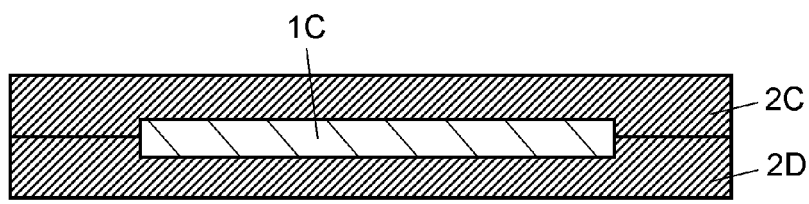
FIG. 4B is a schematic sectional view of still another graphite complex in accordance with the exemplary embodiment.
Figure 4C:
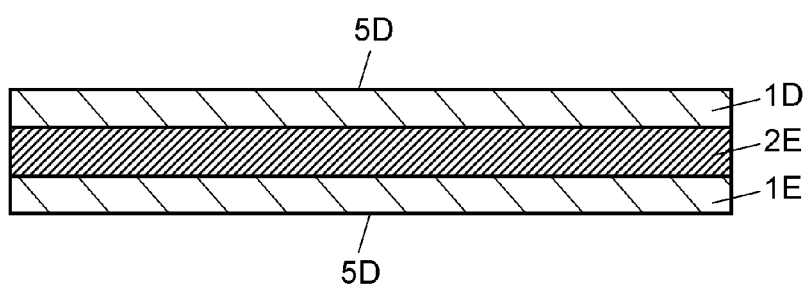
FIG. 4C is a schematic sectional view of yet another graphite complex in accordance with the exemplary embodiment.

FIG. 4A through FIG. 4C are sectional views of other graphite complexes in accordance with the exemplary embodiment. In the graphite complex of FIG. 4A, a plurality of graphite sheets and a plurality of graphite layers are laminated such that graphite sheets 1A and 1B are disposed alternately with graphite layers 2A and 2B. This structure can increase the thickness of the graphite complex, thus enhancing the thermal conductance in the direction along principal surface 5A. Further, as described above, recesses 4 are formed in graphite sheets 1A and 1B by roll-pressing. This structure can increase the joining strength between graphite sheets 1A and 1B and graphite layers 2A and 2B, respectively, in the interfaces. Thus, as shown in FIG. 4A, a plurality of graphite sheets and a plurality of graphite layers can be laminated so as to increase the thickness of the graphite complex.

In each of the graphite complexes shown in FIG. 1 and FIG. 4A, the pyrolytic graphite sheet and the graphite layer are joined across the respective entire principal surfaces. Alternatively, the pyrolytic graphite sheet may be joined to part of the principal surface of the graphite layer, or the graphite layer may be joined to part of the principal surface of the pyrolytic graphite sheet.

Further, in the graphite complex as shown in FIG. 4B, graphite sheet 1C is sandwiched between graphite layers 2C and 2D and embedded therein. Such a structure can also be used.

In the graphite complex of FIG. 4C, graphite layer 2E is sandwiched between graphite sheets 1D and 1E. When graphite sheets 1D and 1E are disposed on the top and bottom principal surfaces 5D of the graphite complex in this manner, graphite layer 2E is exposed to principal surfaces 5D on neither side. Thus, this structure can prevent electrical failures in an electronic device caused by the graphite powder falling off from graphite layer 2E when the graphite complex is used in the electronic device. Therefore, this structure is preferable.

The graphite complex may be covered with a resin film or a metal film. Such a film can protect the graphite complex and enhance handleability.

Next, a manufacturing method of the graphite complex is described. In the following, a description is provided for a case where graphite sheet 8 having recesses 4 is used for a sheet-shaped graphite complex that has one graphite sheet 1 (8) and one graphite layer 2 as shown in FIG. 1.

Figure 5:
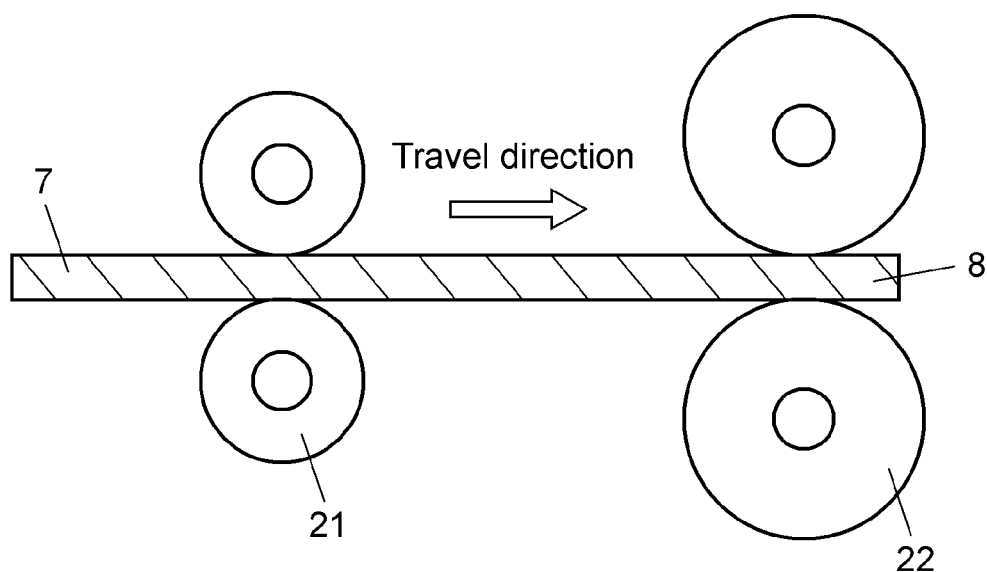
FIG. 5 is a schematic diagram showing a step of roll-pressing the pyrolytic graphite sheet for use in the graphite complex in accordance with the exemplary embodiment.

First, a description is provided for a method of producing graphite sheet 8 with reference to FIG. 5. FIG. 5 is a schematic diagram showing a step of roll-pressing the pyrolytic graphite sheet in accordance with the exemplary embodiment of the present invention.

The temperature of a polymer film having a fixed thickness as the raw material is raised from room temperature in a vacuum or an atmosphere containing inert gas, such as argon and nitrogen, at a temperature rise rate of 1° C./min to 20° C./min. Then, the raw material is graphitized by firing at a temperature of 2500° C. to 3100° C. Thereby, pyrolytic graphite sheet before roll-pressing (hereinafter referred to as graphite sheet) 7 after such high-temperature heat treatment and firing is produced. In graphite sheet 7, there are gaps between the layers in the layered part of the graphite particles, and has the protrusions of the layered part of the graphite particles on the surface of graphite sheet 7.

Next, graphite sheet 7 is roll-pressed. As shown in FIG. 5, in the roll-pressing step, graphite sheet 7 is sandwiched between control rollers 21 disposed on the start side of the travel direction. Further, the graphite sheet is inserted and roll-pressed between pressure rollers 22 disposed on the end side of the travel direction. In this manner, roll-pressed pyrolytic graphite sheet (hereinafter, graphite sheet) 8 is formed.

Control rollers 21 control the travel speed of graphite sheet 7. Pressure rollers 22 are rotated at a speed faster than the travel speed given by control rollers 21. With such setting, graphite sheet 7 is roll-pressed. This increases the friction between graphite sheet 7 and pressure rollers 22, thus allowing the protrusions on the surface of graphite sheet 7 to be folded. As a result, recesses 4 having projections 6 are efficiently formed on the surface of graphite sheet 8.

Preferably, a plurality of rolling operations are performed so as to gradually reduce the thickness of graphite sheet 7. These operations can make the rotation of pressure rollers 22 faster, thus making it easier to form recesses 4 having projections 6. In a case that graphite sheet 8 is formed by firing a polymer film made of polyimide, the average depth of recesses 4 in the roll-pressed graphite sheet ranges from 1 to 4 μm.

Preferably, the compressibility ratio of graphite sheet 8 in roll-pressing ranges from 20% to 80% inclusive, and more preferably, from 45% to 80% inclusive. Roll-pressing the graphite sheet at such a compressibility ratio enhances the joining strength in interface 3 by forming recesses 4.

Preferably, in the case of graphite sheet 8 roll-pressed at a compressibility ratio ranging from 20% to 80% inclusive, the thickness after roll-pressing ranges from 50 μm to 150 μm inclusive. With this thickness, recesses 4 formed by roll-pressing can enhance the joining strength in interface 3.

Here, assuming that P(%) represents the compressibility ratio in roll-pressing, $T_1$ represents the thickness of graphite sheet 7 before roll-pressing, and $T_2$ represents the thickness of graphite sheet 8 after roll-pressing, compressibility ratio P in the roll-pressing is expressed by the following equation:

$$P=(T_1-T_2)/T_1\times 100$$

Next, a description is provided for a manufacturing method of graphite layer 2 using expanded graphite as an example. First, natural graphite is ground, and a mixed solution of concentrated sulfuric acid and concentrated nitric acid is added between the layers of the graphite for acid treatment. Subsequently, the treated material is heated at a high temperature using a gas burner, for example. In this manner, the natural graphite is foamed, so that scaly expanded graphite powder is prepared. Subsequently, this expanded graphite powder is fed onto a belt conveyer and deposited. Then, the deposited material is formed into a sheet shape by pressure rollers. Thus, a molded graphite sheet is prepared.

Preferably, the density of the molded graphite sheet ranges from 0.7 g/cm$^3$ to 1.1 g/cm$^3$ inclusive. A molded graphite sheet having a density equal to or higher than 0.7 g/cm$^3$ can provide excellent handleability when the graphite complex is manufactured. In the case of a molded graphite sheet having a density equal to or lower than 1.1 g/cm$^3$, the compressibility can be increased by pressing in the pressing step. Thus, the joining strength between graphite sheet 1 and graphite layer 2 can be enhanced.

Figure 6:
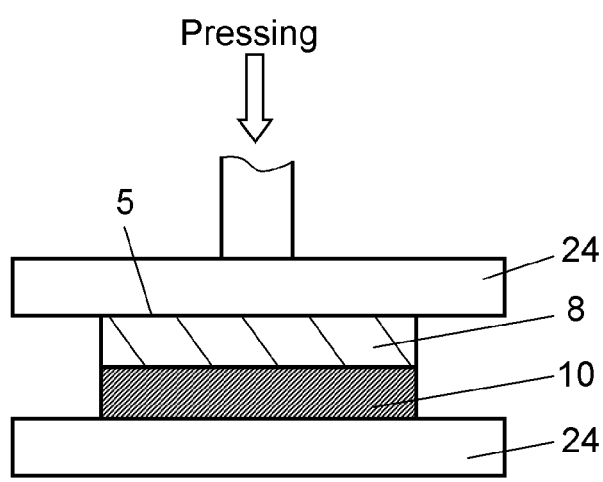
FIG. 6 is a schematic diagram showing a step of pressing the graphite complex in accordance with the exemplary embodiment.

From graphite sheet 1 and the molded graphite sheet thus prepared, a graphite complex is produced. FIG. 6 is a schematic diagram showing a step of pressing the graphite complex in accordance with the exemplary embodiment of the present invention.

First, graphite sheet 8 and molded graphite sheet 10 each cut into a predetermined shape are placed one on the other with the principal surfaces thereof in contact with each other. Thereafter, these sheets are sandwiched by rigid plates 24 of a pressing the and pressed in the direction perpendicular to principal surface 5. By this pressing, the graphite powder of molded graphite sheet 10 are deformed and packed into recesses 4 on the surface of graphite sheet 8. Thus, graphite sheet 8 and molded graphite sheet 10 are press-fitted. As a result, a sheet-shaped graphite complex is formed. The pressing step may be performed by pressing with rollers.

Preferably, the pressure in the pressing step ranges from 30 MPa to 150 MPa inclusive, and more preferably, from 50 MPa to 100 MPa inclusive. Pressing in this pressure range can ensure the joining strength between graphite sheet 8 and molded graphite sheet 10 as graphite layer 2, and provide a sheet shape.

When the pressure is smaller than 30 MPa, delamination occurs between graphite sheet 1 and graphite layer 2 in a high-temperature environment or in handling during use. When the pressure is higher than 150 MPa, fracture occurs in graphite layer 2.

In this manner, graphite sheet 8 and molded graphite sheet 10 are pressed in direct contact with each other without using an adhesive agent or the like. Thereby, the graphite powder of molded graphite sheet 10 can be packed into recesses 4 on the surface of graphite sheet 8. As a result, graphite sheet 1 and graphite layer 2 closely overlaid with each other can increase the thermal conductivity in interface 3. As a result, a graphite complex having a large thermal conductance can be produced.

Use of roll-pressed graphite sheet 8 can enhance the joining strength in interface 3. Thus, laminating a plurality of graphite sheets 8 and a plurality of molded graphite sheets 10 enables a graphite complex to have a large thickness and a large thermal conductance. Further, the graphite complex has excellent handleability.

Hereinafter, specific examples of this exemplary embodiment are described.

EXAMPLE A

The graphite complex of Example A is formed in the following manner. As shown in FIG. 1, one graphite sheet 8 and one molded graphite sheet 10 as graphite layer 2 are laminated and pressed.

Graphite sheet 8 is produced in the following manner. An aromatic polyimide film that is obtained by the condensation polymerization of aromatic tetrabasic acid and aromatic diamine is fired at a temperature of 3000° C., and thereafter roll-pressed. The thickness of graphite sheet 8 is 70 µm, the density thereof is 1.10 g/cm$^3$, the compressibility ratio in roll-pressing is 68%, and the thermal conductivity in the direction along principal surface 5 is 905 W/mK.

Graphite layer 2 is made from molded graphite sheet 10 formed of expanded graphite powder. The density of graphite layer 2 is 1.00 g/cm$^3$ and the thermal conductivity in the direction along principal surface 5 is 200 W/mK. The thickness of molded graphite sheet 10 is set such that the graphite complex has a predetermined thickness after pressing.

Graphite sheet 8 and molded graphite sheet 10 as described above are overlaid with each other and pressed at a pressure of 80 MPa so as to form a sheet-shaped graphite complex of 300 µm in thickness. The thickness of graphite layer 2 after pressing is 57% of the thickness of molded graphite sheet 10 before pressing, and graphite sheet 8 is not compressed.

EXAMPLE B

The graphite complex of Example B is produced in the same manner as the graphite complex of Example A except for the pressure in pressing. That is, graphite sheet 8 is identical to that of Example A, and the thickness of molded graphite sheet 10 is different from that of Example A. The other conditions are the same as those of Example A.

Graphite sheet 8 and molded graphite sheet 10 are laminated and pressed at a pressure of 30 MPa so as to form a graphite complex of 300 µm in thickness. The thickness of graphite layer 2 after pressing is 59% of the thickness of molded graphite sheet 10 before pressing, and graphite sheet 8 is not compressed.

EXAMPLES C AND D

The graphite complexes of Examples C and D are produced in the same manner as the graphite complex of Example A except for graphite sheets 8. Graphite sheets 8 of Examples C and D are made by firing an aromatic polyimide film at a temperature of 3000° C. and roll-pressing the film.

In the case of graphite sheet 8 of Example C, the thickness is 100 µm, the density is 0.85 g/cm$^3$, the compressibility ratio in roll-pressing is 23%, and the thermal conductivity in the direction along principal surface 5 is 700 W/mK. On the other hand, in the case of graphite sheet 8 of Example D, the thickness is 50 µm, the density is 1.54 g/cm$^3$, the compressibility ratio in rolling is 77%, and the thermal conductivity in the direction along principal surface 5 is 1260 W/mK.

Molded graphite sheets 10 for use in Examples C and D are identical to the molded graphite sheet of Example A except for the thickness. Graphite sheet 8 and molded graphite sheet 10 as described above are placed one on the other and pressed at a pressure of 80 MPa so as to form a graphite complex of 300 µm in thickness.

In Example C, pressing makes the thickness of graphite layer 2 after pressing 57% of the thickness of molded graphite sheet 10 before pressing, and makes the thickness of graphite sheet 8 after pressing 75% of that before pressing. On the other hand, in Example D, pressing makes the thickness of graphite layer 2 after pressing 57% of the thickness of molded graphite sheet 10 before pressing, and graphite sheet 8 is not compressed.

EXAMPLE X

Example X only includes graphite sheet 8 that is identical to the graphite sheet for use in Example A. In the case of the graphite sheet of Example X, the thickness is 70 µm, the density is 1.10 g/cm³, and the thermal conductivity in the direction along the principal surface is 905 W/mK.

EXAMPLE Y

Example Y only includes a molded graphite sheet formed of expanded graphite powder, which is made by further pressing a molded graphite sheet having a density of 1.00 g/cm³ at a pressure of 80 MPa. In the case of the molded graphite sheet of Example Y, the thickness is 300 µm, the density is 1.75 g/cm³, and the thermal conductivity in the direction along the principal surface is 350 W/mK.

Figure 7:
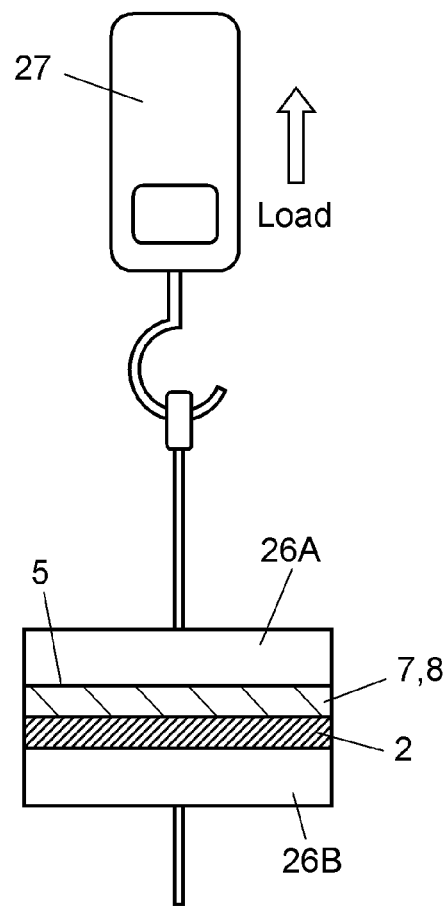
FIG. 7 is a schematic diagram showing a method for measuring joining strength of the graphite complex in accordance with the exemplary embodiment.
Figure 8:
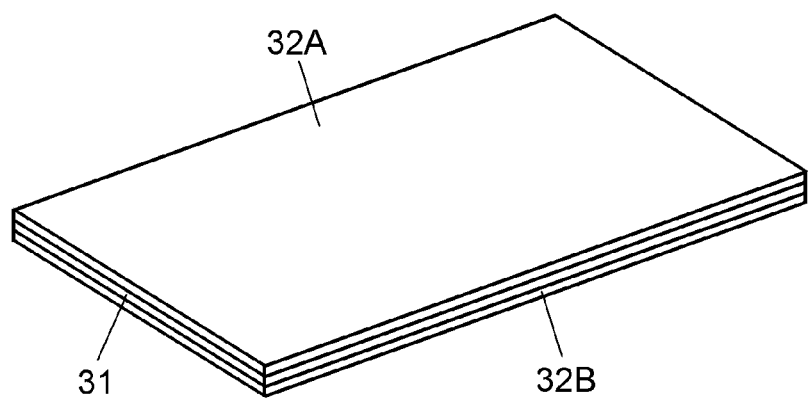
FIG. 8 is a perspective view of a conventional graphite complex.

Next, in each of the graphite complexes of Example A through Example D, the joining strength between graphite sheet 8 and graphite layer 2 is measured. FIG. 7 is a schematic diagram showing a method of measuring joining strength of the graphite complex. In the method of measuring the joining strength, a graphite complex whose principal surface 5 is 20 mm in width and 20 mm in length is used. Graphite sheet 8 is bonded to clamping plate 26A and graphite layer 2 is bonded to clamping plate 26B via double-sided adhesive tapes. Clamping plates 26A and 26B are pulled perpendicularly to principal surface 5 of this graphite complex at a speed of 1.0 cm/min. At this time, the tensile strength at which graphite sheet 8 and graphite layer 2 delaminate is measured with tension gage 27. This tensile strength is defined as the joining strength. The measurement results are shown in Table 1.

Table 1 also shows the thermal conductivity and thermal conductance in the lengthwise direction of the principal surface of the sheet of each of Example A through Example D, Example X, and Example Y. The thermal conductivity of each graphite complex is apparent thermal conductivity. Table 1 shows the results in a case where the principal surface of the sheet is 50 mm in width and 100 mm in length.

TABLE 1

| | Compressibility ratio of graphite sheet in roll-pressing (%) | Pressure in pressing for laminate (MPa) | Thickness (µm) | Thermal conductivity (W/mK) | Thermal conductance (W/° C.) | Joining strength (MPa) |
|---|---|---|---|---|---|---|
| A | 68 | 80 | 300 | 480 | 0.072 | 0.14 |
| B | 68 | 30 | 300 | 475 | 0.071 | 0.07 |
| C | 23 | 80 | 300 | 485 | 0.073 | 0.10 |
| D | 77 | 80 | 300 | 500 | 0.075 | 0.16 |
| X | 68 | — | 70 | 905 | 0.032 | — |
| Y | — | 80 | 300 | 350 | 0.053 | — |

As shown in Table 1, the thermal conductivities of Example A through Example D are 480 W/mK, 475 W/mK, 485 W/mK, and 500 W/mK, respectively, which are substantially equal to each other. The thermal conductances of Example A through Example D are 0.072 W/° C., 0.071 W/° C., 0.073 W/° C., and 0.075 W/° C., respectively. In contrast, the thermal conductance of Example X is 0.032 W/° C., and that of Example Y is 0.053 W/° C.

The thermal conductivity of each of Example A through Example D is smaller than the thermal conductivity of Example X. However, since the thickness of the sheet of each of Example A through Example D is larger than that of Example X, the thermal conductance of each of Example A through Example D is considerably larger. The thickness of the sheet of each of Example A through Example D is equal to that of Example Y. However, since the thermal conductivity of each of Example A through Example D is larger than that of Example Y, the thermal conductance of each of Example A through Example D is considerably larger. In this manner, in the graphite complex where roll-pressed graphite sheet 8 and molded graphite sheet 10 are placed one on the other and joined by pressing, the thermal conductance can be increased.

The joining strengths of Example A through Example D are 0.14 Mpa, 0.07 MPa, 0.10 MPa, and 0.16 MPa, respectively. A graphite complex having joining strength smaller than 0.01 MPa is difficult to handle. However, Example A through Example D can be handled without any problem. The results of Example A and Example B show that in the case of graphite sheets 8 having an equal thickness, a higher pressure in pressing can increase the joining strength. The results of Example A, Example C, and Example D show that a higher compressibility ratio in roll-pressing can increase the joining strength.

EXAMPLE E

The graphite complex of Example E is produced in the same manner as Example A except for the pyrolytic graphite sheet. In Example E, graphite sheet 7 that is similar to the graphite sheet of Example A, but is not roll-pressed after firing is used.

Graphite sheet 7, and molded graphite sheet 10 identical to that of Example A are placed one on the other, and pressed at a pressure of 80 MPa, which is equal to the pressure in Example A, so as to form a sheet-shaped graphite complex. In this graphite complex, the joining strength between graphite sheet 7 and graphite layer 2 is 0.06 MPa. Therefore, the joining strength of Example A is larger than that of Example E. This result shows that use of roll-pressed graphite sheet 8 can considerably enhance the joining strength. However, the joining strength of Example E is larger than 0.01 MPa, and thus raises no serious problem in practical use.

INDUSTRIAL APPLICABILITY

The graphite complex of the present invention has a large thermal conductance. The manufacturing method of the graphite complex of the present invention allows production of a graphite complex having a large thermal conductance. Further, delamination caused by the difference in thermal expansion between the pyrolytic graphite sheet and the graphite layer in a high-temperature environment is minimized. Thus, the present invention is useful for electronic devices, and provides excellent handleability especially in installation in electronic devices.

The invention claimed is:
1. A graphite complex comprising:
   a pyrolytic graphite sheet made by firing a polymer film; and
   a graphite layer containing graphite powder as a main ingredient and directly joined to the pyrolytic graphite sheet, wherein:

a recess is formed in a joining surface of the pyrolytic graphite sheet to the graphite layer, the recess is filled with the graphite powder, and the recess has one or more projections.

2. The graphite complex according to claim 1, wherein the recess in the pyrolytic graphite sheet is formed by roll-pressing the pyrolytic graphite sheet after firing the polymer film.

3. The graphite complex according to claim 1, wherein the one or more projections extend along a direction not perpendicular to the joining surface.

4. A manufacturing method of a graphite complex, comprising the steps of:

firing a polymer film to make a pyrolytic graphite sheet;

roll-pressing the pyrolytic graphite sheet;

overlaying a pyrolytic graphite sheet and a molded graphite sheet with each other so as to make contact with each other after the roll-pressing, the molded graphite sheet being formed of graphite powder as a main ingredient; and joining the pyrolytic graphite sheet and the molded graphite sheet by pressing the pyrolytic graphite sheet and the molded graphite sheet overlaid with each other, wherein:

in the step of roll-pressing the pyrolytic graphite:

the pyrolytic graphite sheet is sandwiched between a plurality of control rollers disposed on a start side of a travel direction, the pyrolytic graphite sheet is inserted and roll-pressed between a plurality of pressure rollers disposed on an end side of the travel direction, the plurality of control rollers control travel speed of the pyrolytic graphite sheet, and the plurality of pressure rollers are rotated at a speed faster than the travel speed given by the plurality of control rollers, and a recess is formed in the pyrolytic graphite sheet in the step of roll-pressing, and the recess is filled with the graphite powder in the step of joining.

* * * * *